much text US010659040B2

(12) United States Patent
Luo

(10) Patent No.: US 10,659,040 B2
(45) Date of Patent: May 19, 2020

(54) CLOCK VOLTAGE STEP-UP CIRCUIT

(71) Applicant: CSMC TECHNOLOGIES FAB2 CO., LTD., Wuxi New District, Jiangsu (CN)

(72) Inventor: Chuan Luo, Jiangsu (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 16/328,402

(22) PCT Filed: Aug. 22, 2017

(86) PCT No.: PCT/CN2017/098473
§ 371 (c)(1),
(2) Date: Feb. 26, 2019

(87) PCT Pub. No.: WO2018/036475
PCT Pub. Date: Mar. 1, 2018

(65) Prior Publication Data
US 2019/0214983 A1 Jul. 11, 2019

(30) Foreign Application Priority Data

Aug. 26, 2016 (CN) .......................... 2016 1 0743269

(51) Int. Cl.
*H03K 17/06* (2006.01)
*H03K 17/687* (2006.01)
*H03K 5/02* (2006.01)

(52) U.S. Cl.
CPC .......... *H03K 17/6872* (2013.01); *H03K 5/02* (2013.01); *H03K 17/06* (2013.01); *H03K 17/063* (2013.01);
(Continued)

(58) Field of Classification Search
CPC .... H03K 17/6872; H03K 17/00; H03K 17/08; H03K 17/06; H03K 17/063;
(Continued)

(56) References Cited

U.S. PATENT DOCUMENTS 5,705,941 A * 1/1998 Fukazawa ........... H01L 27/0266
326/30
6,903,600 B2 * 6/2005 Blodgett ............... H02M 3/073
327/536
2014/0136860 A1 * 5/2014 Schrom .................... G06F 1/26
713/300

FOREIGN PATENT DOCUMENTS

CN  101562444 A  10/2009
CN  101977046 A  2/2011
(Continued)

OTHER PUBLICATIONS

International Search Report dated Nov. 27, 2017 in the parent application PCT/CN2017/098473. 4 pages.

*Primary Examiner* — Jung Kim
(74) *Attorney, Agent, or Firm* — Polsinelli PC

(57) ABSTRACT

A clock voltage step-up circuit comprises a first inverter, a second inverter, a third inverter, a PMOS transistor, and a bootstrap capacitor. An input end of the first inverter is used for inputting a first clock signal. An input end of the second inverter is connected to an output end of the first inverter, and an output end of the second inverter outputs a first control signal used for controlling a sampling switch; and after the first control signal passes through a fourth inverter, a fifth inverter and a sixth inverter, a second control signal used for controlling the sampling switch is generated. An input end of the third inverter is connected to a second clock signal, and the first clock signals and the second clock signals are a set of clock signals, every two of which are not overlapped.

18 Claims, 2 Drawing Sheets

(52) U.S. Cl.
 CPC ............... *H03K 2217/0054* (2013.01); *H03K 2217/0081* (2013.01)

(58) Field of Classification Search
 CPC ............ H03K 2017/066; H03K 17/12; H03K 19/01714; H03K 19/01735
 See application file for complete search history.

(56) References Cited

FOREIGN PATENT DOCUMENTS

| | | |
|---|---|---|
| CN | 102545862 A | 7/2012 |
| CN | 103326700 A | 9/2013 |
| CN | 103762986 A | 4/2014 |
| JP | 2015167331 A | 9/2015 |

\* cited by examiner

CLOCK VOLTAGE STEP-UP CIRCUIT

CROSS REFERENCE TO RELATED APPLICATIONS

This application is a National Phase filing under 35 U.S.C. § 371 of PCT/CN2017/098473 filed on Aug. 22, 2017, and claims priority to Chinese Patent Application No. CN 201610743269.8, entitled "CLOCK VOLTAGE STEP-UP CIRCUIT" filed on Aug. 26, 2016. The entire contents of each application are hereby incorporated by reference.

TECHNICAL FIELD

The present disclosure relates to the field of signal processing technologies, and specifically to a clock voltage step-up circuit.

BACKGROUND

In some high-speed and high-precision signal processing and conversion circuits, processes of sampling and transmission of an analog signal are generally required to be implemented by some switches. Signals that control the switches being turned on and off are generally a set of clock signals. On the premise that characteristics of transistors constructing the switches are unchanged, the higher a high-level voltage of a control signal is, the smaller an on-resistance of each of the switches is, so that a speed at which the analog signal passes through the switches is increased and distortion of the analog signal is reduced.

Currently, a voltage of a switch control signal generated by a clock voltage step-up circuit is generally related to a voltage of a signal to be sampled. When used in some situations that a voltage range of the signal to be sampled is large, the clock voltage step-up circuit may result in some reliability problems due to the voltage of the control signal being too high. Thus, there is a need for a clock voltage step-up circuit to limit step-up amplitude of the voltage of the switch control signal to a safe range to prevent possible reliability problems.

SUMMARY

A clock voltage step-up circuit is provided according to embodiments of the present disclosure. The clock voltage step-up circuit includes a first inverter, a second inverter, a third inverter, a PMOS transistor, and a bootstrap capacitor. An input end of the first inverter is connected to a first clock signal, and an output end of the first inverter is connected to an input end of the second inverter. An output end of the second inverter outputs a first control signal used for controlling a sampling switch. After the first control signal passes through a fourth inverter, a fifth inverter and a sixth inverter, a second control signal used for controlling the sampling switch is generated. An input end of the third inverter is connected to a second clock signal. The first clock signal and the second clock signal are a set of two-phase non-overlapping clock signals. An end of the bootstrap capacitor is connected to an output end of the third inverter, and another end of the bootstrap capacitor is connected to a drain end of the PMOS transistor. A gate end of the PMOS transistor is connected to the drain end of the PMOS transistor, and a source end of the PMOS transistor is connected to a power supply.

On the other hand, a clock voltage step-up circuit is further provided. The clock voltage step-up circuit includes: a first inverter, an input end of the first inverter being configured to input a first clock signal; a second inverter, an input end of the second inverter being connected to an output end of the first inverter, and an output end of the second inverter being configured to output a clock signal with a stepped up voltage; a third inverter, an input end of the third inverter being connected to a second clock signal, and the first clock signal and the second clock signal being a set of two-phase non-overlapping clock signals; a PMOS transistor, a gate end of the PMOS transistor being connected to a drain end of the PMOS transistor, and a source end of the PMOS transistor being configured to be connected to a power supply; and a bootstrap capacitor, an end of the bootstrap capacitor being connected to an output end of the third inverter, and another end of the bootstrap capacitor being connected to the drain end of the PMOS transistor and being connected to the second inverter, to step up the voltage of the clock signal output by the output end of the second inverter.

The above-described clock voltage step-up circuit can avoid possibility of excessive voltage occurring at a circuit node, which improves reliability of the circuit, and implements a simple structure, flexible use, and a small layout area occupied. In addition, the used components are all conventional components under the CMOS process, which avoids the use of higher-price processes, reduces a number of masks, and is more economical and practical.

BRIEF DESCRIPTION OF THE DRAWINGS

The following accompanying drawings of the present disclosure are used herein as a part of the present disclosure to understand the present disclosure. Embodiments of the present disclosure and description thereof are illustrated in the accompanying drawings to explain the principle of the present disclosure.

DETAILED DESCRIPTION OF THE EMBODIMENTS

Figure 1:
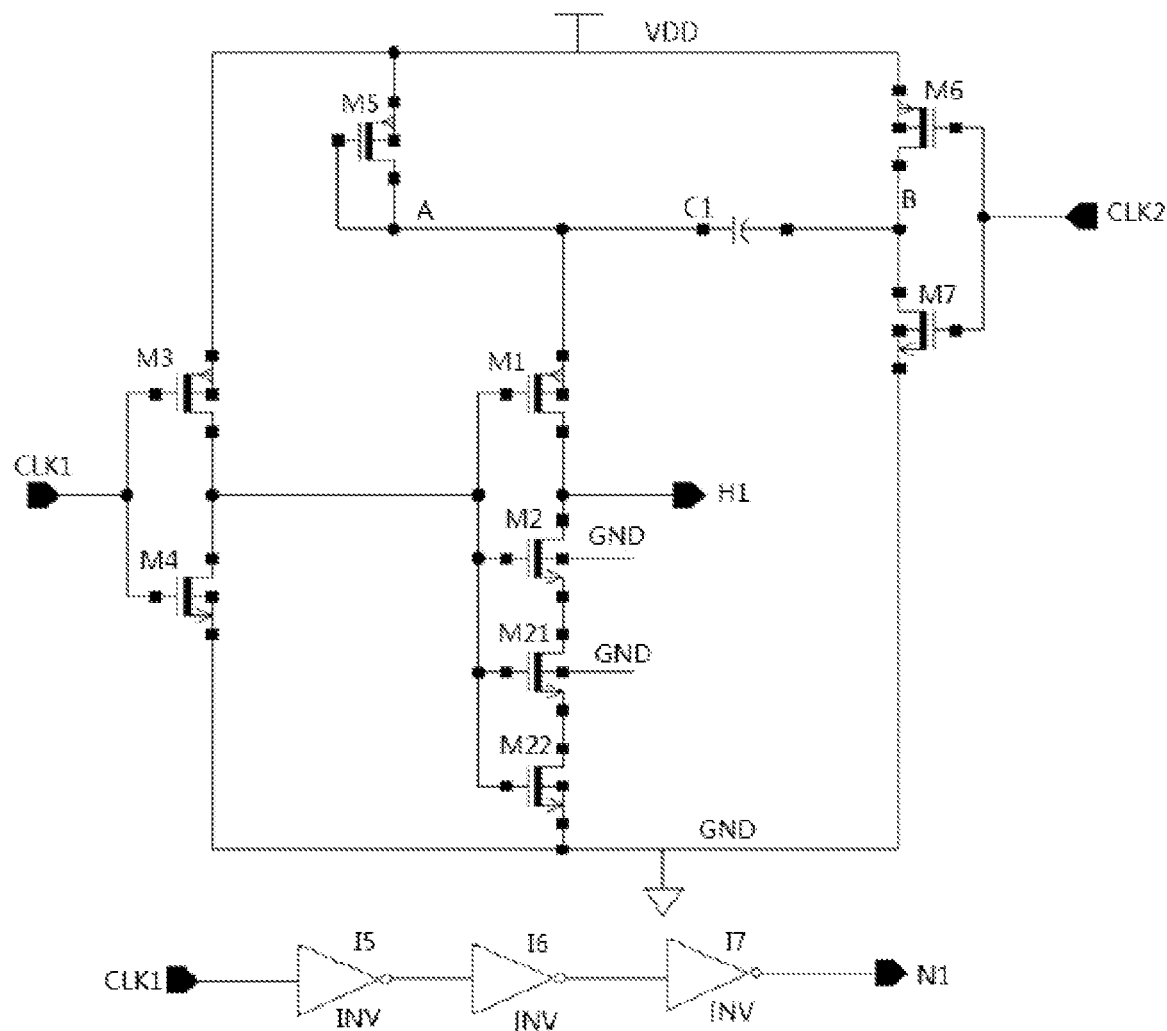
FIG. 1 is a circuit schematic diagram of a clock voltage step-up circuit in an embodiment.

In the description hereafter, numerous specific details are set forth in order to provide a more thorough understanding of the present disclosure. However, it will be apparent to those skilled in the art that the present disclosure may be implemented without one or more of these details. In other examples, in order to avoid confusion with the present disclosure, some technical features known in the art are not described.

It should be understood that the present disclosure can be embodied in different forms and should not be construed as limited to the embodiments set forth herein. Rather, providing these embodiments will make the disclosure thorough and complete, and fully convey the scope of the present disclosure to those skilled in the art.

Terms used herein are for the purpose of only describing specific embodiments and are not intended to be limiting of the present disclosure. As used herein, "a", "one" and "said/the" in a singular form are also intended to include a plural form unless the context clearly indicates other forms.

It should also be understood that the terms "consist" and/or "include", when used in the description, determine presence of the features, integers, steps, operations, elements and/or components, but do not exclude the presence or addition of one or more other features, integers, steps, operations, elements, components, and/or groups. As used herein, the terms "and/or" include any and all combinations of related listed items.

In order to thoroughly understand the present disclosure, detailed steps and detailed structures will be set forth in the following description, so as to explain the technical solutions proposed by the present disclosure. Preferred embodiments of the present disclosure are described in detail below, however in addition to these detailed description, the present disclosure may have other embodiments.

A clock voltage step-up circuit in an embodiment includes a first inverter, a second inverter, a third inverter, a PMOS transistor, and a bootstrap capacitor. An input end of the first inverter is configured to input to a first clock signal, and an output end of the first inverter is connected to an input end of the second inverter. An output end of the second inverter outputs a first control signal used for controlling a sampling switch. After the first control signal passes through a fourth inverter, a fifth inverter and a sixth inverter, a second control signal used for controlling the sampling switch is generated. An input end of the third inverter is configured to input a second clock signal. The first clock signal and the second clock signal are a set of two-phase non-overlapping clock signals. An end of the bootstrap capacitor is connected to an output end of the third inverter, and another end of the bootstrap capacitor is connected to a drain end of the PMOS transistor and is connected to the second inverter, so as to step up a voltage of the first control signal. A gate end of the PMOS transistor is connected to the drain end of the PMOS transistor, and a source end of the PMOS transistor is connected to a power supply.

The first inverter, the second inverter and the third inverter may all include one PMOS transistor and one NMOS transistor. In an example, the second inverter may include one PMOS transistor and a plurality of NMOS transistors, and the plurality of NMOS transistors are inverse narrow width effects MOS (INWE MOS) transistors connected in series.

The above-described clock voltage step-up circuit can avoid possibility of excessive voltage occurred at a circuit node, which improves reliability of the circuit, and implements a simple structure, flexible use, and a small layout area occupied. In addition, the used components are all conventional components under the CMOS process, which avoids the use of higher-price processes, reduces a number of masks, and is more economical and practical.

FIG. 1 is a circuit schematic diagram of a clock voltage step-up circuit in an embodiment. As shown in FIG. 1, the clock voltage step-up circuit includes a first inverter, a second inverter, a third inverter, a bootstrap capacitor C1, and a PMOS transistor M5. The first inverter includes a PMOS transistor M3 and a NMOS transistor M4. The second inverter includes a PMOS transistor M1 and NMOS transistors M2, M21 and M22, and substrates of M2 and M21 are grounded (GND). The third inverter includes a PMOS transistor M6 and a NMOS transistor M7.

Figure 2:
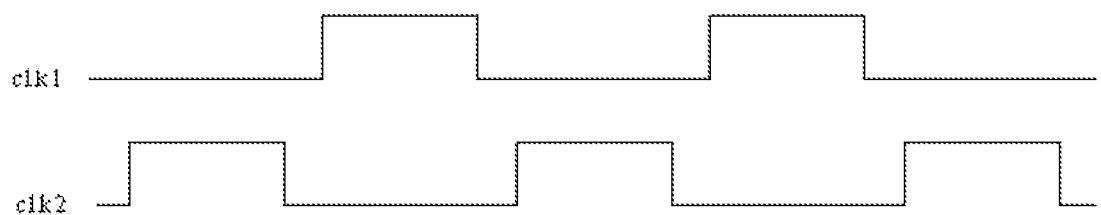
FIG. 2 is a schematic diagram of two-phase non-overlapping clock signals of a clock voltage step-up circuit in an embodiment.

An input end of the first inverter is connected to a first clock signal CLK1, and an output end of the first inverter is connected to an input end of the second inverter. An output end of the second inverter outputs a first control signal H1 used for controlling a sampling switch (such as a CMOS sampling switch shown in FIG. 3). After the first control signal CLK1 passes through a fourth inverter I5, a fifth inverter I6 and a sixth inverter I7, a second control signal N1 used for controlling the sampling switch is generated. An input end of the third inverter is connected to a second clock signal CLK2. The first clock signal CLK1 and the second clock signal CLK2 are a set of two-phase non-overlapping clock signals (as shown in FIG. 2). An end of the bootstrap capacitor C1 is connected to an output end of the third inverter, and another end of the bootstrap capacitor C1 is connected to a drain end of the PMOS transistor M5. A gate end of the PMOS transistor M5 is connected to the drain end of the PMOS transistor M5, and a source end of the PMOS transistor M5 is connected to a power supply VDD.

In the above-described clock voltage step-up circuit, when CLK2 is at a high level and CLK1 is at a low level, charging current passes through a channel of M5 and charges a voltage at point A of the drain end of M5 to VDD−Vth; when CLK2 and CLK1 both are at the low level, the voltage at point A is momentarily raised to 2*VDD−Vth, but since the voltage at point A has already been higher than VDD−Vth, a PN junction between the drain end and a substrate end of M5 is forwardly turned on at this time, the current flows to VDD through this PN junction, and the voltage at point A is quickly pulled down to VDD+Vpn; and when CLK1 becomes the high level, a port H1 can output a voltage of VDD+Vpn, thereby completing a function of controlling step-up of the voltage level. Vth is a turn-on threshold voltage of M5, which is generally 0.5V to 1V. Vpn is a forward turn-on voltage of the PN junction, which is generally about 0.7V.

In addition, in FIG. 1, the second inverter includes one PMOS transistor and three NMOS transistors, that is, the PMOS transistor M1, and the NMOS transistors M2, M21 and M22. The three transistors M2, M21 and M22 are INWE MOS transistors, which are characterized by having a channel with a long length and a short width, so that after the three INWE MOS transistors are connected in series, leakage current in the channels of the three transistors can be greatly reduced when CLK1 is at the high level, which greatly slows down the leakage of charges at point A on C1. In this way, the clock voltage step-up circuit can operate at a very low clock frequency.

In FIG. 1, the second inverter includes one PMOS transistor and three NMOS transistors. In an embodiment, the second inverter includes one PMOS transistor and a plurality of NMOS transistors. The plurality of NMOS transistors are the INWE MOS transistors connected in series. A size and/or a number of the INWE MOS transistors may be set according to an operating frequency of the clock voltage step-up circuit, or may be appropriately adjusted and optimized according to the operating frequency of the clock voltage step-up circuit.

In an embodiment, like the first inverter and the third inverter, the second inverter may also only include one PMOS transistor and one NMOS transistor.

In the above-described clock voltage step-up circuit, a circuit structure is simplified, a common PMOS component is adopt instead of two NPN transistors which do not exist in the CMOS process, and the PMOS component charges the capacitor by the channel current and discharges the capacitor through the forward PN junction, functioning as the original two NPN transistors. Thus, the components used in the clock voltage step-up circuit are all common components under the conventional CMOS process, and no special components are used, therefore costs are lower and a range of application is wider. In addition, the clock voltage step-up circuit may also optimize the circuit structure, thereby reducing the leakage current, so that the clock voltage step-up circuit may operate at a very low clock frequency.

Figure 3:
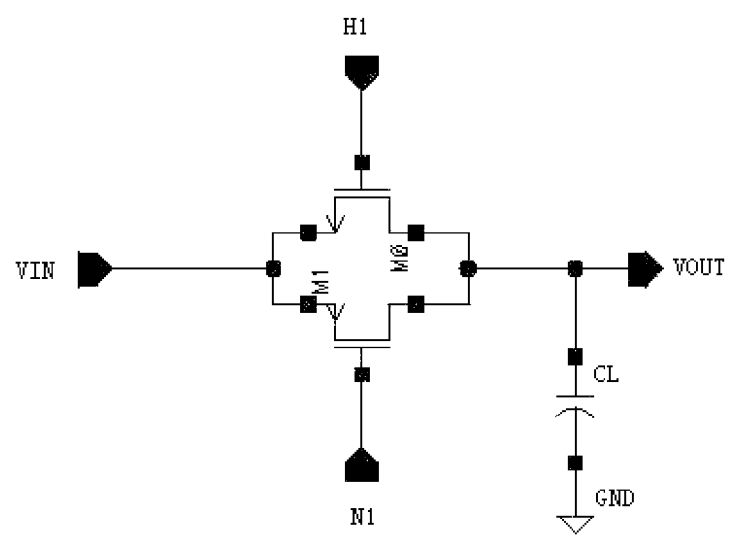
FIG. 3 is a circuit schematic diagram of a CMOS sampling switch to which a clock voltage step-up circuit can be applied in an embodiment.

FIG. 3 is a circuit schematic diagram of a CMOS sampling switch to which a clock voltage step-up circuit can be applied in an embodiment. As shown in FIG. 3, the CMOS sampling switch includes one NMOS transistor M0, one PMOS transistor M1 and one load capacitor CL. A gate end of the NMOS transistor M0 is connected to the first control signal H1. A gate end of the PMOS transistor M1 is connected to the second control signal N1. Source ends of the NMOS transistor M0 and the PMOS transistor M1 are connected to each other and are connected to an input signal VIN used for sampling. Drain ends of the NMOS transistor M0 and the PMOS transistor M1 are connected to each other and are connected to the load capacitor CL. The other end of the load capacitor is grounded. Based on the first control signal H1 and the second control signal N1, the CMOS sampling switch samples the input signal VIN, and outputs a sampling result VOUT.

FIG. 3 only exemplarily shows a switch to which the clock voltage step-up circuit according to the embodiment of the present disclosure may be applied. The clock voltage step-up circuit according to the embodiment of the present disclosure may also be applied to other switches. In addition, the clock voltage step-up circuit according to the embodiment of the present disclosure may also be applied to other situations.

In general, the clock voltage step-up circuit has a simple structure, and flexible use, which avoids the possibility of excessive voltage at the circuit node, and improves the reliability of the circuit. In addition, the above-described clock voltage step-up circuit has a small layout area occupied, and the used components are all conventional components under CMOS process, which avoids the use of higher-price processes, reduces a number of masks, and is more economical and practical. In addition, by optimizing the structure of the above-described clock voltage step-up circuit, the circuit can be operated at a very low clock frequency.

Although the above-described exemplary embodiments have been described with reference to the accompanying drawings, it should be understood that the above-described exemplary embodiments are merely exemplary, and are not intended to limit the scope of the present disclosure thereto. Various variations and modifications may be made by those of ordinary skill in the art without departing from the scope and spirit of the present disclosure. All of these variations and modifications are intended to be included within the scope of the present disclosure as claimed in the appended claims.

Those of ordinary skill in the art may realize that units and algorithm steps of each example described with reference to the embodiments disclosed herein can be implemented by electronic hardware, or a combination of computer software and electronic hardware. Whether these functions are executed in hardware or software depends on the specific application and design constraint condition of the technical solutions. Professionals may use different methods to implement the described functions for each specific application, but such implementations should not be considered as beyond the scope of the present disclosure.

In the description provided herein, numerous specific details are described. However, it can be understood that the embodiments of the present disclosure may be practiced without these specific details. In some examples, well-known methods, structures, and techniques are not illustrated in detail so as not to obscure the understanding of this description.

Similarly, it should be understood that, in order to simplify the present disclosure and help to understand one or more aspects of the present disclosure, in the description of the exemplary embodiments of the present disclosure, features of the present disclosure are sometimes grouped together into a single embodiment, a drawing, or description thereof. However, the method of the present disclosure should not be interpreted as reflecting the following intention that the claimed present disclosure are required more features than the features explicitly recited in each claim. More definitely, as reflected in the corresponding claims, the present disclosure focus on that a corresponding technical problem can be solved with features less than all the features of a disclosed single embodiment. Accordingly, the claims that follow the specific embodiment are hereby explicitly incorporated into the specific embodiment, wherein each of the claims itself serves as a separate embodiment of the present disclosure.

It will be understood by those skilled in the art that, any combination may be used to combine all of the features disclosed in this description (including the accompanying claims, abstract, and drawings) and all of the processes or units of any method or apparatus disclosed herein, except that the features are mutually exclusive. Unless explicitly stated otherwise, each feature disclosed in this description (including any accompanying claims, abstract and drawings) may be replaced by alternative features providing the same, equivalent or similar purpose.

In addition, those skilled in the art can understand that, although some of the embodiments described herein include certain features included in other embodiments rather than other features, combinations of features of different embodiments are meant to be within the scope of the present disclosure and form different embodiments. For example, in the claims, any one of the claimed embodiments may be used in any combination.

The above description is only specific embodiments of the present disclosure or description thereof, and the protection scope of the present disclosure is not limited thereto. Variations or alternatives that may readily occur to those skilled in the art within the scope of the disclosed technology should be encompassed within the scope of the present disclosure. The protection scope of the present disclosure should be depended on the protection scope of the claims.

What is claimed is:

1. A clock voltage step-up circuit comprising:
a first inverter, an input end of the first inverter being configured to input a first clock signal;
a second inverter, an input end of the second inverter being connected to an output end of the first inverter, an output end of the second inverter outputting a first control signal used for controlling a sampling switch, and after the first clock signal passes through a fourth inverter, a fifth inverter and a sixth inverter, a second control signal used for controlling the sampling switch being generated;
a third inverter, an input end of the third inverter being configured to input a second clock signal, and the first clock signal and the second clock signal being a set of two-phase non-overlapping clock signals;
a PMOS transistor, a gate end of the PMOS transistor being connected to a drain end of the PMOS transistor, and a source end of the PMOS transistor being configured to be connected to a power supply; and a bootstrap capacitor, an end of the bootstrap capacitor being connected to an output end of the third inverter, and another end of the bootstrap capacitor being connected to the drain end of the PMOS transistor and being connected to the second inverter, to step up a voltage of the first control signal.

2. The clock voltage step-up circuit according to claim 1, wherein the second inverter comprises one PMOS transistor and a plurality of NMOS transistors, and the plurality of NMOS transistors are inverse narrow width effects MOS transistors connected in series.

3. The clock voltage step-up circuit according to claim 2, wherein a size and/or a number of the inverse narrow width effects MOS transistors are set according to an operating frequency of the clock voltage step-up circuit.

4. The clock voltage step-up circuit according to claim 2, wherein the second inverter comprises one PMOS transistor and three NMOS transistors.

5. The clock voltage step-up circuit according to claim 4, wherein a substrate of each of the inverse narrow width effects MOS transistors is grounded.

6. The clock voltage step-up circuit according to claim 1, wherein the second inverter comprises one PMOS transistor and one NMOS transistor.

7. The clock voltage step-up circuit according to claim 1, wherein the first inverter comprises one PMOS transistor and one NMOS transistor.

8. The clock voltage step-up circuit according to claim 1, wherein the third inverter comprises one PMOS transistor and one NMOS transistor.

9. The clock voltage step-up circuit according to claim 1, wherein the sampling switch is a CMOS sampling switch.

10. The clock voltage step-up circuit according to claim 9, wherein the CMOS sampling switch comprises one NMOS transistor, one PMOS transistor and a load capacitor, a gate end of the NMOS transistor is connected to the first control signal, a gate end of the PMOS transistor is connected to the second control signal, source ends of the NMOS transistor and the PMOS transistor are connected to each other and are connected to an input signal used for sampling, and drain ends of the NMOS transistor and the PMOS transistor are connected to each other and are connected to the load capacitor.

11. A clock voltage step-up circuit comprising:
a first inverter, an input end of the first inverter being configured to input a first clock signal;
a second inverter, an input end of the second inverter being connected to an output end of the first inverter, and an output end of the second inverter being configured to output a clock signal with a stepped up voltage;
a third inverter, an input end of the third inverter being configured to input a second clock signal, and the first clock signal and the second clock signal being a set of two-phase non-overlapping clock signals;
a PMOS transistor, a gate end of the PMOS transistor being connected to a drain end of the PMOS transistor, and a source end of the PMOS transistor being configured to be connected to a power supply; and
a bootstrap capacitor, an end of the bootstrap capacitor being connected to an output end of the third inverter, and another end of the bootstrap capacitor being connected to the drain end of the PMOS transistor and being connected to the second inverter, to step up a voltage of the clock signal output by the output end of the second inverter.

12. The clock voltage step-up circuit according to claim 11, wherein the second inverter comprises one PMOS transistor and a plurality of NMOS transistors, the plurality of NMOS transistors are inverse narrow width effects MOS transistors connected in series, gate ends of the one PMOS transistor and the plurality of NMOS transistors serve as the input end of the second inverter, and a drain end of the one PMOS transistor serves as the output end of the second inverter, and is connected in series to the plurality of the NMOS transistors, and is grounded through the plurality of the NMOS transistors.

13. The clock voltage step-up circuit according to claim 12, wherein the second inverter comprises one PMOS transistor and three NMOS transistors.

14. The clock voltage step-up circuit according to claim 12, wherein a substrate of each of the inverse narrow width effects MOS transistors is grounded.

15. The clock voltage step-up circuit according to claim 11, wherein the second inverter comprises one PMOS transistor and one NMOS transistor, gate ends of the one PMOS transistor and the NMOS transistor serve as the input end of the second inverter, a drain end of the one PMOS transistor is connected to a drain end of the NMOS transistor, serving as the output end of the second inverter, and a source end of the NMOS transistor is grounded.

16. The clock voltage step-up circuit according to claim 11, wherein the first inverter comprises one PMOS transistor and one NMOS transistor, gate ends of the one PMOS transistor and the NMOS transistor serve as the input end of the first inverter, a drain end of the one PMOS transistor is connected to a drain end of the NMOS transistor, serving as the output end of the first inverter, and a source end of the NMOS transistor is grounded.

17. The clock voltage step-up circuit according to claim 11, wherein the third inverter comprises one PMOS transistor and one NMOS transistor, gate ends of the one PMOS transistor and the NMOS transistor serve as the input end of the third inverter, a drain end of the one PMOS transistor is connected to a drain end of the NMOS transistor, serving as the output end of the third inverter, and a source end of the NMOS transistor is grounded.

18. The clock voltage step-up circuit according to claim 11, wherein the clock signal with the stepped up voltage output by the second inverter is used for controlling a CMOS sampling switch.

* * * * *